NOISE LIMITER FOR RADIO RECEIVERS

Filed April 30, 1947

Inventor:
Paul O. Farnham,

By Pierce, Scheffler + Parker,
Attorneys.

Patented Jan. 16, 1951 2,538,150

UNITED STATES PATENT OFFICE 2,538,150

NOISE LIMITER FOR RADIO RECEIVERS

Paul O. Farnham, Mountain Lakes, N. J., assignor to Aircraft Radio Corporation, Boonton, N. J., a corporation of New Jersey Application April 30, 1947, Serial No. 744,978

8 Claims. (Cl. 250—20)

The present invention relates to noise limiters for radio receivers, and more particularly to series noise limiters which suppress noise peaks in excess of preselected modulation percentages.

Objects of the invention are to provide noise limiter circuits which do not require a separate tube, or set of thermionic tube elements, for the noise limiter operation. Objects are to provide noise limiter circuits in which a single tube, or a single set of tube elements in the case of dual tubes, serves both as the noise limiter and as the first audio frequency amplifier. A further object is to provide a combined noise limiter-audio amplifier stage having a carrier level meter in the plate-cathode circuit.

These and other objects and the advantages of the invention will be apparent from the following specification when taken with the accompanying drawings in which.

Figure 1:
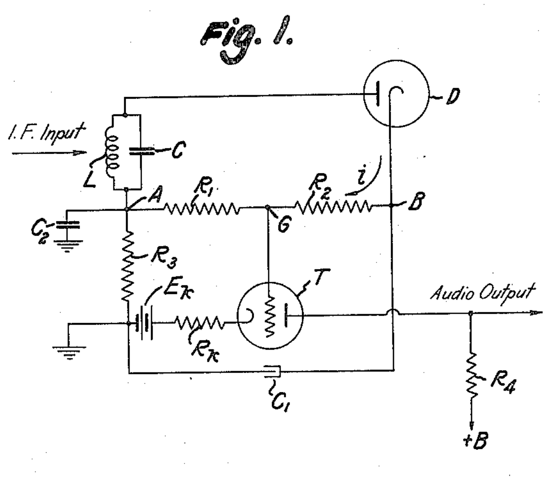
Fig. 1 is a schematic circuit diagram of a detector-noise limiter-audio amplifier embodying the invention.

In the Fig. 1 circuit, the reference character D identifies a diode detector having a tuned input circuit comprising an inductance L and shunt condenser C, and an output circuit comprising resistors $R_1$ and $R_2$ in series. The inductance L may be the secondary of the output transformer in the last stage of the intermediate frequency amplifier of the receiver, as is indicated by the legend "I. F. Input." The cathode of the detector D is connected to ground through an audio or modulation frequency by-pass condenser $C_1$, and the input circuit LC is grounded through a smaller condenser $C_2$ which is a by-pass for only the signal carrier frequency, or the intermediate frequency in the case of a superheterodyne receiver. For convenience of description, the outer terminals of the diode output resistors $R_1$, $R_2$ are identified as points A and B, the point A being the junction of the diode input and output circuits, and the point B being the cathode end of the output resistors.

The junction G of the resistors $R_1$, $R_2$ is connected to the grid of a triode T, and the terminal A of resistor $R_1$ is connected to the cathode of tube T through a resistor $R_3$, a grid bias source which is shown schematically as a battery $E_k$, and a cathode bias resistor $R_k$, the junction of resistor $R_3$ and battery $E_k$ being grounded. The plate circuit load is shown as a resistor $R_4$, but the audio output may be taken from the resistor $R_k$, or from both resistors $R_4$ and $R_k$ when push-pull amplification is desired.

The grid bias developed by the battery $E_k$ is preferably selected or adjusted to a value just sufficient to produce cut-off in the triode T with no carrier wave or intermediate frequency signal on the diode D, and it is therefore obvious that the tube T can function as an audio frequency amplifier at grid bias values more positive than this critical value for cut-off. The value of the cathode resistor $R_k$ is not critical but it is made sufficiently high to provide a good linear degenerative amplifier action when the point G is carried positive by signal rectification in the diode D.

The tube T also functions as a noise limiter to clip voltage peaks above a selected modulation percentage which is determined by the relative values of resistors $R_1$ and $R_2$, and which is independent of the carrier wave or intermediate frequency level. The noise limiter operation and its independence of carrier level will be apparent from a study of the voltages established at different points in the triode input circuit by the rectified output of the diode D.

If an unmodulated carrier or intermediate frequency signal is impressed upon the diode D, a direct current voltage is developed across the diode load resistances $R_1$ and $R_2$. The direct current potential at point B is positive with respect to that of point A, since the rectified current flows in the direction indicated by the arrow *i*. The voltage with respect to the ground reference increases linearly with ohmic resistance from zero at point A to a maximum positive value at point B. This condition is shown graphically in Fig. 2 by the lines marked "$m=o$" of the groups of lines *a* and *b* which are plotted for intermediate frequency signals of such amplitudes as to develop direct current voltages across resistors $R_1$, $R_2$ of 10 volts and 20 volts respectively. When the input signals are modulated, the diode output current varies at the modulation frequency, but the resulting changes in the instantaneous potential drop along resistors $R_1$, $R_2$ do not alter the potential at point B since this point is by-passed to ground for modulation frequencies by the condenser $C_1$. The instantaneous potential of point A therefore rises and falls with the modulation frequency variations of the rectified current since point A is by-passed to ground only through the carrier frequency by-pass condenser $C_2$. The resistor $R_3$ and condenser $C_1$ provide a path between points A and B in parallel with the diode output resistances $R_1$, $R_2$, but the values of $R_3$ and $C_1$ are so selected that their time constant is substantially longer than the lowest modulation frequency to be transmitted. If the lowest modulation frequency of interest is 100 cycles per second, the time constant of $R_3$, $C_1$ should be such that the potential of point A will not fluctuate significantly at modulation frequencies below about 20 to 30 cycles per second.

If the received signal is modulated 100%, the potential of point A swings to positive and negative values algebraically equal to the positive potential developed at the point B. The positive voltage excursions of point A are developed by the valleys of the modulation envelope and such voltage excursions are not shown in Fig. 2 as they do not affect the noise limiter operation. The peaks of the modulation envelope produce the negative voltage excursions of point A, and the most negative voltage excursions of various points along the resistors $R_1$, $R_2$ are indicated in Fig. 2 by the lines marked "$m$=50" and "$m$=100" for 50% and 100% modulations, respectively.

It is to be noted that the lines "$m$=100" for different carrier levels intersect at the zero potential axis AB, and that the lines "$m$=50" also intersect at the zero axis. The practical significance of this relationship is that the location along resistances $R_1$, $R_2$ of a point which is carried to zero potential by the peaks of the modulation envelope depends only upon the modulation percentage and is independent of the carrier or intermediate frequency level. The point of zero instantaneous potential for a signal of a given modulation percentage $m_c$ is the junction G of resistors $R_1$ and $R_2$ of relative values which satisfy the equation $$m_c=\frac{R_1}{R_2}$$

Assuming that the noise limiter is to suppress the transmission of voltage peaks in excess of 100% modulation, the resistor $R_2$ should have a value equal to that of resistor $R_1$. An unmodulated carrier of a level which develops a direct current potential of 10 volts at point B will develop a potential of 5 volts at point G. The grid of tube T is therefore more positive with respect to the cathode than it was in the absence of carrier signal, and the tube T is conductive and amplifies those voltage variations at point G which are derived from the modulation envelope. At the assumed 100% modulation, the potential of point G, and therefore of the grid of tube T, is reduced to zero by maximum peaks of the modulation envelope and transmission through the tube T is thereby just reduced to zero since the bias battery $E_k$ which blocks transmission in the absence of a signal input to the detector D is at this instant the only voltage impressed between grid and cathode of the tube T. Voltage peaks of more than 100% modulation, for example voltage peaks due to ignition, establish instantaneous negative potentials on the grid, and thereby suppress transmission. The same clipping of noise peaks above 100% modulation obtains at other carrier levels since, as is apparent from the geometry of the lines of the Fig. 2 voltage chart, all "$m$=100" lines which may be drawn for different carrier levels will intersect at that point along the zero voltage axis for which $R_2$=$R_1$.

Figure 2:
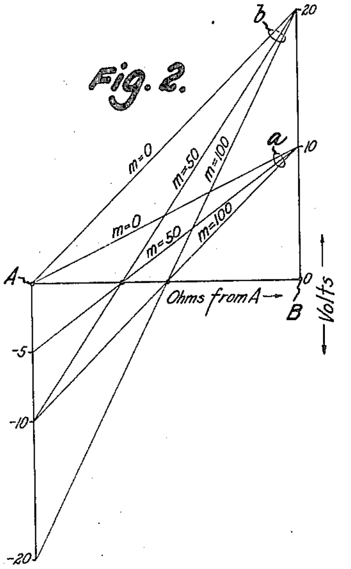
Fig. 2 is a chart showing the most negative potentials established at points along the detector output resistance by two carrier waves of different amplitude and each assumed to carry audio frequency amplitude modulation of the indicated modulation percentages.

It is apparent from an inspection of Figs. 1 and 2 that only a portion of the modulation frequency voltage developed across the diode output resistances $R_1$, $R_2$ is impressed upon the grid of the limiter-audio amplifier tube T. This follows from the fact that the grid is conductively connected to the point G which is spaced from the point A at which the full audio voltage variation is developed. It is not essential that the grid of tube T be connected to the same point of the diode output circuit for audio frequency and direct current voltages.

Figure 3:
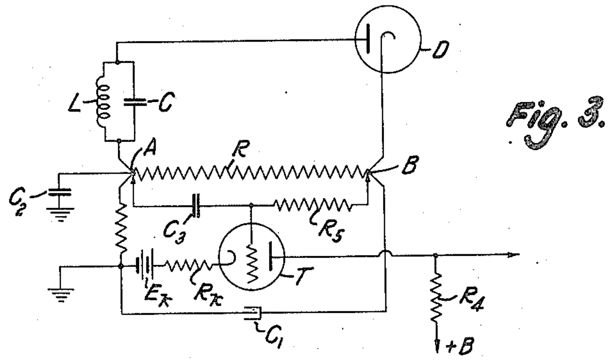
Fig. 3 is a circuit diagram of another embodiment in which the audio transmission and the modulation percentage at which the noise limiter comes into operation may be adjusted independently of each other.

The noise limiter audio amplifier circuit of Fig. 3 differs from that illustrated in Fig. 1 in that the audio frequency connection of the control grid of tube T to the diode output resistance R (corresponding to serially connected resistors $R_1$ and $R_2$ of the Fig. 1 circuit) is through a condenser $C_3$, and the direct current connection is through a high resistance leak $R_5$. The outer ends of these couplings are taps which are adjustable along the resistor R. When condenser $C_3$ is connected to point A and resistor $R_5$ is connected to point B, as shown in Fig. 3, the audio transmission is a maximum and the noise peaks above 100% modulation will be clipped. If the tap of resistor $R_5$ is moved from point B towards point A, and the tap of condenser $C_3$ is simultaneously moved from point A towards point B at the same rate, the noise suppression above 100% modulation will be maintained until the tap of resistor $R_5$ reaches point A and the tap of condenser $C_3$ reaches point B. During this excursion there will be a progressive reduction in the audio transmission to the grid of tube T which reaches zero when the tap of condenser $C_3$ is at point B. When the taps of condenser $C_3$ and resistor $R_5$ are both at the mid-point of resistor R, the noise limiter clips peaks above 100% modulation and the audio transmission is reduced one-half. This special case corresponds exactly with the Fig. 1 circuit when resistors $R_1$ and $R_2$ are of the same value, and the condenser $C_3$ and resistor $R_5$ may be eliminated by a direct connection of the grid of tube T to the mid-ohm point of resistor R. If the connection of condenser $C_3$ is left on point A and the tap of resistor $R_5$ is moved from point B towards point A, the modulation percentage $m_c$ above which noise suppression takes place will be reduced progressively from 100% to zero without loss in the audio frequency transmission. If the connection of resistor $R_5$ is left on point B and the tap of condenser $C_3$ is moved from point A towards point B, the modulation percentage of clipping will be increased progressively from 100% to ∞% with a corresponding progressive decrease in audio transmission to zero when the tap of condenser $C_3$ reaches point B.

Figure 4:
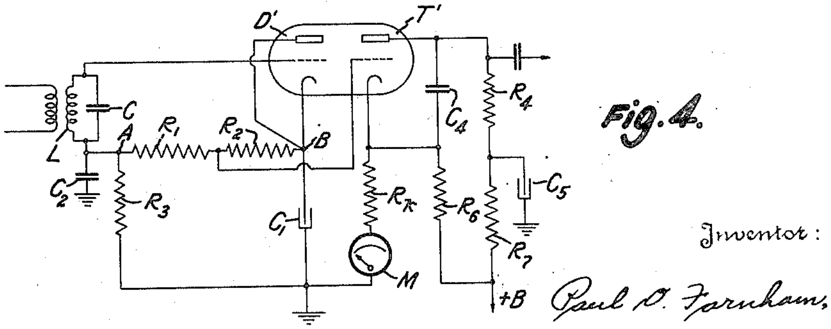
Fig. 4 is a circuit diagram of a commercial embodiment of the invention.

One practical embodiment of the invention, as illustrated in Fig. 4, employs a dual triode tube of Type 14F7 as the diode detector D' and noise limiter-audio amplifier T'. The anode of the triode section D' is connected to the cathode, one terminal of the input circuit LC is directly connected to the grid of detector D' and the other terminal is connected through resistors $R_1$ and $R_2$ in series to the cathode of detector D'. The outer terminals A, B of resistors $R_1$, $R_2$ are connected to ground, as in the Fig. 1 circuit, through a resistor $R_3$ and condenser $C_1$ respectively. The cathode of tube section T' is connected to ground through a cathode resistor $R_k$ and a direct current measuring instrument M which functions as a tuning meter. The amplified audio voltage is developed across the plate circuit resistor $R_4$ and a holding condenser $C_4$ is connected between the plate and cathode of the tube section T'. A bleed resistor $R_6$ is connected between the plate voltage source, indicated by the symbol "+B" and the cathode end of the resistor $R_k$. The bleeder current through resistor $R_k$ establishes a bias on the grid of tube section T' which corresponds to the bias voltage derived from the battery $E_k$ of the noise limiter circuits of Figs. 1 and 3. A filter for suppressing hum when the receiver is energized by rectification of alternating current is provided by a series resistor $R_7$ in the plate circuit of tube section T' and a condenser $C_5$ which grounds the junction of plate circuit resistors $R_4$ and $R_7$.

The Fig. 4 circuit has been employed in a VHF receiver of the superheterodyne type having an intermediate frequency of 15 megacycles and, as originally constructed, the diode output resistors $R_1$, $R_2$ were the sections of a linear law 50,000 ohm potentiometer. Tests showed that the noise limiter provided excellent clipping over a wide range of modulation percentages, i. e. from 5% to 100% as determined by adjustment of the potentiometer tap, and that the clipping at any selected modulation percentage was independent of the carrier level at the diode D'. Adjustment of the noise limiter level is usually unnecessary and, in general, it is preferable to employ fixed resistors $R_1$, $R_2$ in the radio receiver. The 50,000 ohm potentiometer was therefore replaced by resistors $R_1$, $R_2$ of 22,000 and 30,000 ohms respectively which were found by test to provide a clipping of voltage peaks above 100% modulation. This departure of the values of $R_1$ and $R_2$ from equality, which is the condition theoretically appropriate for the suppression of peaks above 100% modulation, is believed to be due to the inclusion in the plate circuit of tube T' of the filter resistor $R_7$ in series with the load resistor $R_4$.

The values of the elements of the Fig. 4 circuit are not critical and the following data with respect to one practical embodiment are illustrative of appropriate values but it is to be understood that the invention is not limited to this or any other combination of specific circuit values.

| | |
|---|---|
| $R_k$=20,000 ohms | $C_1$=0.1 microfarad |
| $R_3$=510,000 ohms | $C_2$=180 micromicrofarads |
| $R_4$=20,000 ohms | $C_4$=750 micromicrofarads |
| $R_7$=100,000 ohms | $C_5$=0.15 microfarads |

For a +B voltage of 240 volts, $R_6$=1 megohm

The novel noise limiter-audio amplifier circuits permit the use of a relatively insensitive and rugged instrument M to check the tuning of the receiver to an incoming signal of a desired frequency. Prior tuning meter systems in which the meter was located in the detector output circuit required a highly sensitive, and therefore expensive, instrument since the maximum direct current was of the order of up to about 100 microamperes. The noise limiter-amplifier circuits of this invention are unusual in that they provide a power amplification of the detector direct current output, thereby raising the direct current (which varies with the carrier level) by a factor of the order of 10 to 1, and upward. The tuning meter M of this invention may therefore be of relatively low sensitivity, and correspondingly inexpensive, due to the direct current amplification of tube T'. It is particularly to be noted that indication of carrier level is independent of the presence and/or strength of a modulation on the carrier wave. The tuning meter M may be located between the plate of tube T' and ground, the only essential requirement being that it is a series element in the plate-cathode circuit.

It will be apparent that the invention is not restricted to the use of a noise limiter-audio amplifier tube of the triode type. Tubes of the triode type have been quite satisfactory but tubes of various multiple grid types may of course be employed.

I claim:

1. A noise limiter circuit for connection to a resistance load across which a detector develops a direct current voltage and a modulation frequency voltage by rectification of a modulated carrier wave, said circuit comprising an electronic tube having a control grid and anode cooperating with a cathode, a condenser of low impedance at modulation frequencies connected between ground and that end of the resistance load which is carried to positive direct current potential by the detector rectification of carrier wave energy, a condenser of low impedance at carrier frequency and of high impedance at modulation frequencies connected between the other end of the resistance load and ground, a cathode circuit connected between said cathode and ground and including a source of steady bias potential and an impedance degenerative to modulation frequencies and to rectified direct current voltages, and input and output circuit networks connected between the grounded end of said cathode circuit and respectively said grid and said anode; said input circuit network including a conductive connection between said other end of the resistance load and the grounded end of said cathode circuit, and circuit means connecting said grid to said resistance load to impose upon the grid direct current and modulation frequency voltages developed along said resistance load by detector rectification of a modulated carrier wave, said circuit means including a conductive circuit element between said grid and said resistance load.

2. A noise limiter circuit as recited in claim 1, wherein said conductive circuit element is of low impedance at modulation frequencies.

3. A noise limiter circuit as recited in claim 1, wherein said conductive circuit element is a high resistance leak connected between the grid and a point on said resistance load, and said circuit means includes a condenser of low impedance at modulation frequencies connected between said grid and another point on said resistance load.

4. A noise limiter circuit as recited in claim 1, wherein said conductive connection between said resistance load and said cathode circuit comprises a resistance having a high impedance at modulation frequencies.

5. In a noise limiter circuit, the combination with a resistance across which a detector develops direct current and modulation frequency voltages by rectification of a modulated carrier wave, of an electronic tube including a control grid and a plate cooperating with a cathode to function as an amplifier, a plate to cathode circuit including a source of direct current plate supply voltage having the negative potential end thereof grounded, means connecting the control grid to an intermediate point of said resistance, condenser means by-passing the positive voltage end of said resistance to ground for modulation frequencies, means grounding the other end of said resistance for carrier frequencies, conductive means connecting said other end of the resistance to ground, and means connected between said cathode and ground to bias said tube to block conduction in the absence of detector output voltage and to develop an instantaneous potential proportional to the detector output voltage across said resistance.

6. In a noise limiter circuit, the invention as recited in claim 5, in combination with a tuning meter comprising a direct current measuring instrument as a series element in the plate-cathode circuit of said tube.

7. In a radio receiver, the combination with a detector having an output circuit including a resistance across which said detector develops a modulation frequency voltage and a direct current voltage varying in magnitude with the carrier level of the modulated carrier voltage impressed upon the detector, a condenser of low impedance at modulation frequencies connected between ground and that end of said resistance which is carried to positive direct current potential by the detector rectification of carrier wave energy, a condenser of low impedance at carrier frequency and of high impedance at modulation frequencies connected between the other end of said resistance and ground, and a resistor of high impedance at modulation frequencies connected between said other end of the resistance and the grounded end of said first condenser, said resistor and said first condenser constituting a series circuit in parallel with said resistance and having a time constant substantially longer than the lowest modulation frequency to be received; of an amplifier tube comprising a grid and plate cooperating with a cathode, a conductive connection from the grid of said amplifier tube to a point on said resistance, a cathode circuit including a source of steady bias potential and an impedance degenerative to modulation frequency and rectified direct current voltages connected between said cathode and ground whereby amplified modulation frequency and direct current voltages are developed in the plate-cathode circuit of said tube, a modulation frequency impedance connected between said plate and cathode, and a tuning meter in said plate-cathode circuit.

8. In a radio receiver, the invention as recited in claim 7, wherein said cathode circuit includes a source of direct current voltage of a magnitude biasing said tubes substantially to suppress conduction therethrough in the absence of a carrier frequency input to said detector; whereby said tuning meter reading is zero in the absence of a signal input, and becomes quite positive and varies in magnitude with the amplitude of the carrier frequency energy impressed upon the detector.

PAUL O. FARNHAM.

REFERENCES CITED

The following references are of record in the file of this patent:

UNITED STATES PATENTS

| Number | Name | Date |
|---|---|---|
| 2,003,110 | Farnham | May 28, 1935 |
| 2,049,750 | Seeley | Aug. 4, 1936 |
| 2,054,664 | Starrett | Sept. 15, 1936 |
| 2,083,474 | Robinson | June 8, 1937 |
| 2,101,891 | Beers | Dec. 14, 1937 |
| 2,166,694 | Selby | July 18, 1939 |
| 2,211,010 | Hallmark | Aug. 13, 1940 |
| 2,232,856 | Idle | Feb. 25, 1941 |
| 2,235,550 | Fyler | Mar. 18, 1941 |
| 2,500,505 | Arnold | Mar. 14, 1950 |